United States Patent [19]

York

[11] 3,934,188

[45] Jan. 20, 1976

[54] SELF-TESTING BATTERY DISCHARGE INDICATOR

[75] Inventor: Robert A. York, Mechanicsburg, Pa.

[73] Assignee: Flight Systems, Inc., Mechanicsburg, Pa.

[22] Filed: Feb. 4, 1975

[21] Appl. No.: 546,960

Related U.S. Application Data

[63] Continuation-in-part of Ser. No. 536,134, Dec. 24, 1974.

[52] U.S. Cl. .................. 320/48; 320/40; 340/249; 324/29.5
[51] Int. Cl.² .................. H02J 7/00; G08B 21/00
[58] Field of Search .......... 320/39, 40, 48; 318/139; 340/249; 324/29.5

[56] References Cited
UNITED STATES PATENTS

| | | | |
|---|---|---|---|
| 3,529,230 | 9/1970 | Tedd | 320/48 |
| 3,852,732 | 12/1974 | Yorksie et al. | 320/48 X |

Primary Examiner—William M. Shoop
Assistant Examiner—Robert J. Hickey
Attorney, Agent, or Firm—Seidel, Gonda & Goldhammer

[57] ABSTRACT

The voltage of a battery connected to a load is monitored to provide a continuous instantaneous indication of the voltage level of the battery and to provide an indication that the battery voltage has fallen to some critical level. Means are provided for generating a control signal which is representative of the battery voltage when the apparatus is operated in the battery testing mode and an independent voltage when the apparatus is operated in the self-testing mode. A first indicator means responsive to the control signal is provided for continually indicating the instantaneous level of the battery voltage when the apparatus is operating in the battery testing mode and the instantaneous level of the independent voltage when the apparatus is operating in the self-testing mode. A second indicator means is provided for indicating that the battery voltage has dropped below a first predetermined value when the apparatus is operating in the battery testing mode or that the independent value when the apparatus is operating in the self-testing mode. The second indicator means also disables the load after a predetermined time period has elapsed following a decrease in the battery voltage below the first predetermined value when the apparatus is operating in the battery testing mode or after a decrease in the independent voltage below the second predetermined level when the apparatus is operating in the self-testing mode.

19 Claims, 3 Drawing Figures

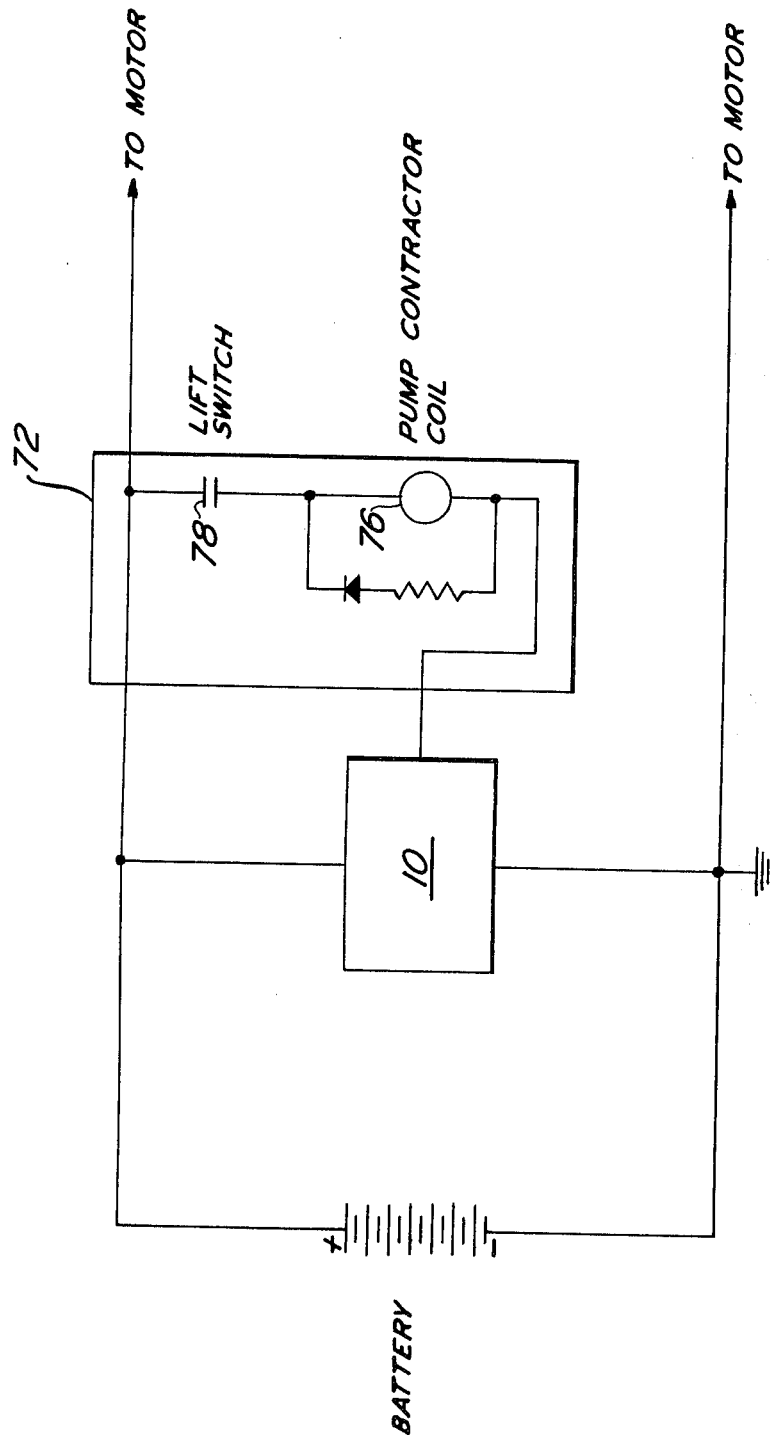

SELF-TESTING BATTERY DISCHARGE INDICATOR

CROSS-REFERENCE TO RELATED APPLICATIONS

The present invention is a continuation-in-part of my co-pending application entitled "Self-Testing Battery Discharge Indicator", Ser. No. 536,134 filed Dec. 24, 1974.

BACKGROUND OF THE INVENTION

The present invention relates to a battery discharge indicator. More particularly, the present invention relates to a battery discharge indicator which indicates the voltage for the battery and automatically disconnects a load connected to the battery when the battery voltage drops below a predetermined value. Furthermore, the present invention relates to battery discharge indicators having a self-test capability.

Various devices for sensing the state of charge of a battery and for disconnecting a load connected to the battery are known in the prior art. A battery connected to a load will drive the load until the battery is incapable of supplying the current necessary for proper operation of the load. For example, a truck battery connected to a lift pump will drive the pump until the continued load of the battery causes the battery charge to be depleted so that the battery can no longer supply the required voltage for operating the pump.

Although devices are known for sensing the state of charge of a battery and for disconnecting a load connected to the battery when the charge drops below a predetermined level, these devices only warn the operator of the vehicle that the battery has discharged to a critical level and do not indicate the relative charge in the battery before the critical level is reached. Examples of such prior art devices can be found in U.S. Pat. Nos. 3,475,061; 3,568,175; and 3,786,342. Other prior art devices provide no visual indication of the state of charge of the battery so that the load continues to drain the battery of its charge until the load is automatically disconnected after the specified interval of time has expired. In either class of devices, an operator is not given the opportunity to disconnect the load from the battery and to recharge the battery before it becomes substantially depleted of its charge.

The present invention overcomes this deficiency by providing a continuous indication of the instantaneous battery voltage. By so providing a means for reading continuously and directly the exact amount of energy left in the battery, the operator of the vehicle is given the option of recharging the battery before it reaches the critical level. Additionally, if there is any malfunction in the warning and disabling circuitry which would otherwise warn of a drop in battery voltage below a critical level and disable the load a short time thereafter, there is a continuous visual indication of the state of charge of the battery.

Furthermore, conventional devices for indicating the state of charge of a battery do not have a self-testing capability. That is, these devices operate only in response to the actual rate of decay of the battery charged. Consequently, a conventional device may be defective, as manufactured, or may malfunction during the course of operation, and be unable to disconnect the load from the battery when the critical level of discharge is reached. As a result, the battery may become damaged permanently due to the continued operation below the discharge level.

For these reasons, a battery discharge indicator device is needed for indicating the state of charge of the battery and for providing the operator with an opportunity to disconnect the battery from the load so that is can be removed and recharged. Such a device should also have a self-testing capability to forewarn the indicator that it will not operate to indicate the state of charge of the battery or disconnect the load when the battery charge is sufficiently depleted.

A principal advantage of the present invention is that it provides a continuous indication of the instantaneous battery voltage thereby permitting the operator to remove and recharge the battery before it reaches a critical level and before the load is automatically disconnected.

A further advantage of the present invention is that it can automatically test itself before the battery charge has been appreciably depleted due to the operation of the load.

Other advantages appear below in the detailed description of the preferred embodiment.

For the purpose of illustrating the invention, there is shown in the drawings a form which is presently preferred; it being understood, however, that this invention is not limited to the precise arrangements and instrumentalities shown.

BRIEF DESCRIPTION OF THE DRAWINGS

FIG. 2 is a schematic diagram of a load connected to the present invention.

DETAILED DESCRIPTION OF THE PREFERRED EMBODIMENT

Figure 1A:
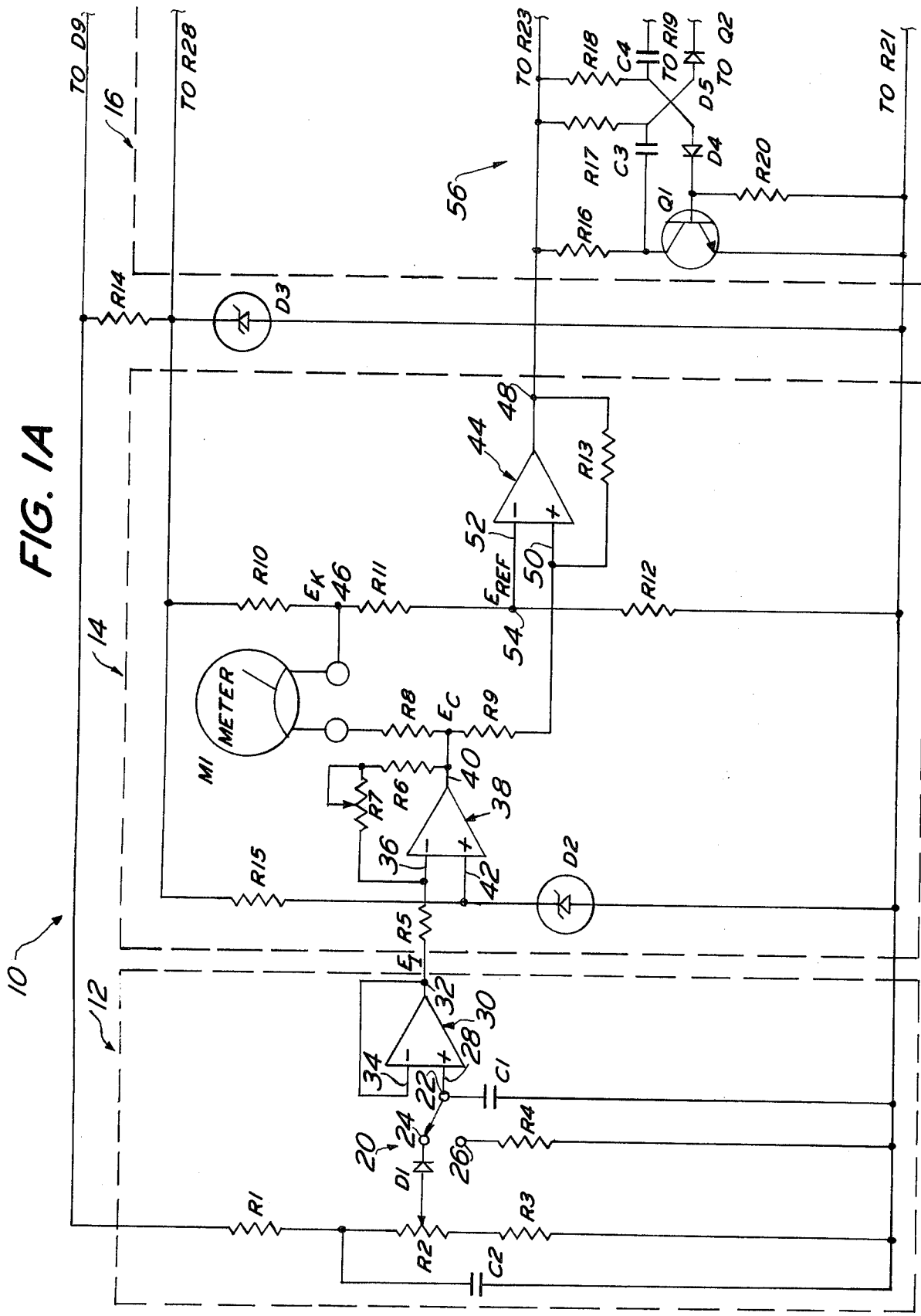
FIGS. 1A and 1B together form a schematic diagram of a self-testing battery discharge indicator circuit constructed in accordance with the principles of the present invention.
Figure 1B:
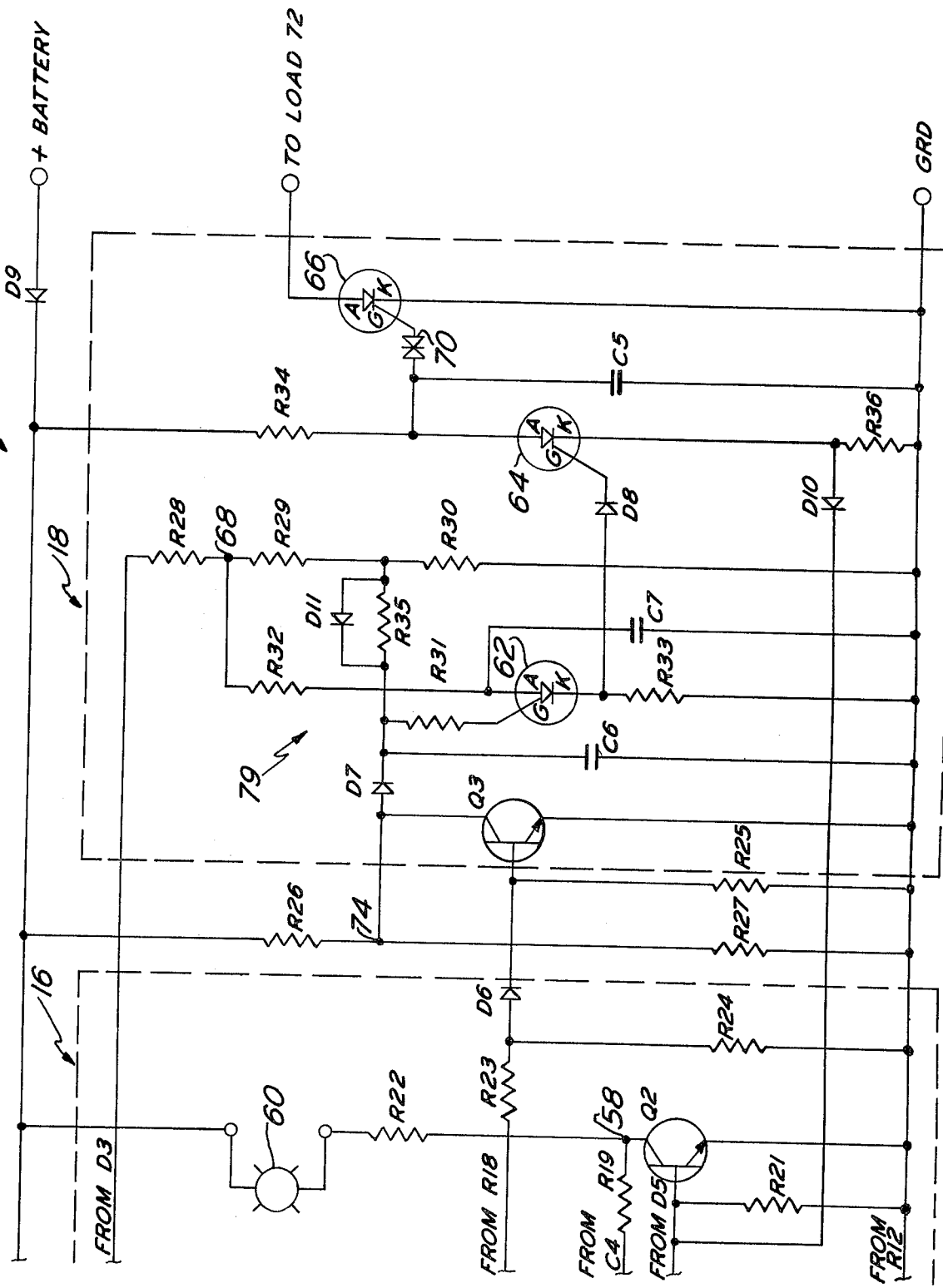

Referring to the drawings, wherein like numerals indicate like elements, a battery, such as a vehicle battery used in a forklift truck, is connected to a load 72 and to a battery discharge indicator and self-testing circuit constructed in accordance with the principles of the present invention and designated generally as 10 in FIGS. 1A and 1B. More specifically, the battery is connected to circuit 10 which includes an input selector circuit 12, a threshold detector and continuous energy indicator circuit 14, a low energy indicator circuit 16, and a delay timer and disabling circuit 18.

The present invention is designed to continually monitor the condition of the battery voltage, to warn the operator of the vehicle that the battery has fallen to some critical level and to disable the load a short time thereafter. Particularly, the load is to be disabled after a predetermined time interval has passed since the battery voltage has fallen to some critical value $E_{cr}$. $E_{cr}$ is a predetermined battery voltage which approaches the minimum safe operating voltage $E_{min}$ of the battery but is still within the safe operating range defined by the minimum safe operating voltage $E_{min}$ and a maximum normal operating voltage $E_{max}$. In order to insure that the vehicle is not operated when the battery falls below the minimum safe operating voltage $E_{min}$, the present invention warns the operator of the vehicle that the battery voltage has fallen to the critical value $E_{cr}$ and then disconnects the load a predetermined time interval after the critical voltage has been reached. By way of example, not limitation, a typical safe operating range of the battery is between 36 and 40 volts dc. If it is desirable to warn the operator of the vehicle that the battery should be recharged once it falls to within 5 percent of the minimum safe operating voltage $E_{min}$, $E_{cr}$ would be 36.2 volts.

Referring now to FIGS. 1A and 1B, the battery is connected through input selector circuit 12 to threshold detector and continuous energy indicator circuit 14. As noted, above, the present invention is capable of operating in two modes; a battery testing mode and a self-testing mode. The mode of operation of circuit 10 is determined by the position of contact arm S1 of single pole, double throw switch 20. In particular, switch 20 includes three terminals, 22, 24 and 26, and a contact arm S1 connected to terminal 22. The switch 20 may be any suitable two position switch; by way of example, it may be a push button type switch which, in one position, connects terminals 22 and 24, and in the other position, connects terminals 22 and 26.

When operating in the battery testing mode, switch 20 is in the position shown in FIG. 1A wherein terminal 22 is connected to terminal 24. In this position, switch 20 connects the battery voltage to the input of threshold detector and continuous energy indicator circuit 14. When operating in the self-testing mode, contact arm S1 is switched to the alternate position wherein terminal 22 is connected to terminal 26. In this condition, a decaying voltage determined by the voltage across capacitor C1 is connected to the input of threshold detector and continuous energy indicator circuit 14.

More particularly, when operating in the battery testing mode, switch 20 applies a fixed percentage of the battery voltage to the non-inverting input 28 of operational amplifier 30, the particular percentage being dependent upon the voltage divider comprising resistors R1, R2 and R3. R2 is a variable resistor and can be adjusted to select the exact percentage of the battery voltage desired. As will be shown in greater detail below, resistor R2 (in conjunction with resistor R7) will determine the value of battery voltage at which low energy indicator circuit 16 and delay timer and disabling circuit 18 will be enabled. Alternatively, when operating in the self-testing mode, the decaying voltage representing the voltage across capacitor C1 is applied to the non-inverting input terminal 28 of operational amplifier 30.

Operational amplifier 30 is a standard operational amplifier which is connected to act as a follower circuit. Particularly, the output 32 of operational amplifier 30 is directly connected to its inverting input terminal 34 and its non-inverting input 28 is connected to terminal 22 of switch 20. So connected, operational amplifier 30 exhibits an extremely high input impedance and low output impedance which, in conjunction with capacitor C2, will resist rapid voltage changes in the battery voltage so that transient drops in battery voltage due to such factors as increased load conditions will not effect the operation of threshold detector and continuous energy indicator circuit 14.

The voltage $E_I$ at output terminal 32 of operational amplifier 30, is the input to threshold detector and continuous energy indicator circuit 14. Since the follower circuit exhibits a unity gain factor, it should be recognized that the voltage $E_I$ at terminal 32 will be directly proportional to the battery voltage during the battery testing mode of operation and equal to the exponentially decaying voltage across capacitor C1 during the self-testing mode of operation.

From the above, it can be seen that the function of input selector circuit 12 is to generate an input voltage $E_I$ which is applied to threshold detector and continuous energy indicator circuit 14. Particularly, the input voltage $E_I$ is selectively representative of the actual battery voltage or the independent decaying voltage generated by the RC circuit comprising capacitor C1 and resistor R4.

The function of threshold detector and continuous energy indicator circuit 14 is to continually monitor the battery voltage and to generate an enabling signal $E_{sat}$ when the battery voltage falls to the critical level $E_{cr}$. The input voltage $E_I$ into threshold detector and continuous energy indicator circuit 14 is applied through resistor R5 to the non-inverting input terminal 36 of operational amplifier 38. Operational amplifier 38 is a standard operational amplifier which has been connected to operate as a difference amplifier. More specifically, output terminal 40 of operational amplifier 38 is connected to its inverting input terminal 36 through resistors R6 and R7. A constant voltage is applied to the non-inverting input terminal 42 by Zener diode D2 which is biased by the battery voltage through resistors R14 and R15.

Since operational amplifier 30 is connected to operate as a difference amplifier, the output signal at terminal 40 is proportional to the difference between the voltages appearing at the non-inverting input terminal 42 of operational amplifier 38 and the output terminal 32 of operational amplifier 30. Since terminal 42 is connected through Zener diode D2 to ground, a relatively constant voltage signal appears thereat. In contrast, the voltage at output terminal 32 decreases in accordance with the decreasing battery voltage. As such, as the battery voltage decreases, the output voltage $E_c$ appearing at output terminal 40 of operational amplifier 38 will increase. The output voltage $E_c$ of operational amplifier 38 is a control voltage which controls the operation of meter M1 and operational amplifier 44.

Meter M1 may be any standard volt meter such as Stewart Warner volt meter model number 80060. In the preferred embodiment, meter M1 is calibrated from 0 to 100 percent wherein a 0 meter reading indicates that the battery has fallen to the minimum safe operating voltage $E_{min}$ and a 100 meter reading indicates that the battery is fully charged to the maximum normal operating voltage $E_{max}$. The purpose of meter M1 is to provide the operator of the vehicle with a continuous instantaneous indication of the relative charge in the battery. Since meter M1 is connected between resistor R8 and junction 46, it literally indicates the potential difference between output terminal 40 and junction 46. Junction 46 is kept at a constant voltage $E_k'$ by Zener diode D3 and the voltage divider comprising resistors R10, R11 and R12. In the preferred embodiment, the constant voltage $E_k$ is chosen so that it will always be greater than the control voltage $E_c$ in order that increasing control voltage causes a decreasing voltage across meter M1. Under these conditions, a decrease in the battery voltage results in a corresponding decrease in meter reading M1.

As noted above, the control voltage $E_c$ is also applied to operational amplifier 44. The function of operational amplifier 44 is to generate an enabling signal which will enable low energy indicator circuit 16 and delay timer and disabling circuit 18 when the battery voltage has fallen to the critical value $E_{cr}$. Operational amplifier 44 is a standard operational amplifier, which has been connected to operate as a comparator. Particularly, output terminal 48 is connected to the non-inverting input terminal 50 through resistor R13. In addition, inverting input terminal 52 has connected to a constant referral voltage $E_{ref}$ determined by Zener diode D3 and the voltage divider circuit comprising resistors R10, R11 and R12.

The output signal at terminal 48 of operational amplifier 44, therefore, is switched between two voltage levels in response to the relative value of control voltage $E_c$ and reference voltage $E_{ref}$. Particularly, when the control voltage $E_c$ is greater than the reference voltage $E_{ref}$, terminal 48 will be at the $+E_{sat}$ value and when the control voltage $E_c$ is less than the reference voltage $E_{ref}$, terminal 48 will be at the $-E_{sat}$ value. The output of operational amplifier 44, therefore, is directly dependent upon the value of the control voltage $E_c$. As mentioned above, control voltage $E_c$ is inversely proportional to the battery voltage and will increase as the battery voltage decreases. As such, as the battery voltage decreases towards the critical value $E_{cr}$ the control voltage increases towards the reference voltage $E_{ref}$. Finally, when the critical battery voltage is reached, the control voltage surpasses the reference voltage and the output of operational amplifier 44 switches from the $-E_{sat}$ condition to the $-E_{sat}$ condition.

Since resistor R2 controls the relationship between the battery voltage and the input signal $E_I$ to threshold detector and continuous energy indicator circuit 14 and resistor R7 controls the amplification factor of the operational amplifier 38, these resistors control the relationship between the battery voltage and the control voltage $E_c$. As such, it becomes possible to select the exact battery voltage $E_{cr}$ which will cause the operational amplifier 44 to switch states by simply adjusting resistors R2 and R7 as desired.

As noted above, the output of operational amplifier 44 controls the operation of both low energy indicator circuit 16 and delay timer and disabling circuit 18. Particularly, when the battery voltage is less than the critical value $E_{cr}$, the output terminal 48 will be at the negative saturation value $-E_{sat}$ and transistors Q1, Q2 and Q3 will be off. When the battery voltage reaches the critical value, output terminal 48 will switch to the $+E_{sat}$ value and both low energy indicator circuit 16 and delay timer and disabling circuit 18 will be enabled.

Referring to low energy indicator circuit 16 first, the positive saturation voltage at terminal 48 will enable astable multivibrator circuit 56 which comprises transistors Q1 and Q2, resistors R14, R15, R16, R17, R18 and R19, capacitors C3 and C4, and diodes D4 and D5. The operation of astable multivibrator circuit 56 is well-known and need not be described in detail. Generally, when terminal 48 switches to the $+E_{sat}$ value, the transistors Q1 and Q2 will alternately be driven into saturation and cutoff. More particularly, as transistor Q1 turns on its collector is clamped to ground. This decrease in collector voltage is immediately coupled to the base of transistor Q2 through capacitor C3 and diode D5, thereby turning Q2 off. This condition is maintained as long as the charging current through capacitor C3 develops sufficient voltage across resistor R17 to hold Q2 cutoff. The time constant of C3 and R17, therefore, determines the time that Q2 remains cut off. As the capacitor C3 charges, the base of transistor Q2 will become increasingly positive until the voltage drop across resistor R17 is insufficient to keep Q2 off. As a result of this regenerative action, transistor Q2 is driven into saturation and its collector clamped to ground. The decreased collector voltage is immediately clamped to the base of transistor Q1 through capacitor C4 and diode D4 turning transistor Q1 off. This condition is maintained as long as the voltage drop across resistor R18 is sufficient to hold Q1 cut off. Since Q1 is off, capacitor C4 will begin charging towards $+E_{sat}$ volts. The charging current through capacitor C4 decreases exponentially with time and eventually becomes so small that the voltage developed across resistor R18 is insufficient to hold Q1 off. At this time, Q1 turns on and the cycle is repeated.

In accordance with the above discussion, junction 58 at the collector of transistor Q2 alternately switches between ground and an open circuit condition, alternately enabling and disabling indicator lamp 60. Indicator lamp 60 will therefore flash on and off whenever the battery voltage has fallen to the critical value $E_{cr}$ and the output of operational amplifier 44 has switched from the $-E_{sat}$ to the $+E_{sat}$ condition.

As noted above, the output of operational amplifier 44 is also applied to delay timer and disabling circuit 18. Circuit 18 disconnects the load 72 after a predetermined time period has elapsed following a decrease in the battery voltage to the critical value $E_{cr}$. Circuit 18 comprises transistor Q3, Programmable Unijunction Transistor (PUT) 62, Silicon Controlled Rectifier (SCR) 64 and Silicon Controlled Rectifier (SCR) 66. Generally, the collector of transistor Q3 is connected to the gate of PUT 62 through diode D7 and resistor R31. The anode of PUT 62 is connected through R32 to a constant voltage appearing at junction 68, and the cathode of PUT 62 is connected through resistor R33 to ground. The cathode of PUT 62 is also connected through diode D8 to the gate of SCR 64. The anode of SCR 64 is connected to the battery voltage through resistor R34 and diode D9, and the cathode of SCR 64 is connected through resistor R36 to ground. The anode of SCR 64 is also connected through Diac 70 to the gate of SCR 66. The anode of SCR 66 is connected to load 72 and the cathode of SCR 66 is connected to ground.

Examining the condition of circuit 18 before the battery voltage has fallen to the critical value $E_{cr}$, the control voltage $E_c$ will be at the $-E_{sat}$ value and transistor Q3 will be biased off. Particularly, a portion of the $-E_{sat}$ volts appearing at output terminal 48 will be applied to the anode of diode D6 through the voltage divider comprising resistors R23 and R24. In this condition, diode D6 will be biased off and the base of transistor Q3 will be clamped to ground through resistor R25. Transistor Q3 will thereby be biased off and diode D7 will be forward biased by the battery voltage and the voltage divider comprising resistors R26 and R27. Since diode D7 is forward biased, the voltage appearing at junction 74 is applied through resistor R31 to the gate of PUT 62. PUT 62 will remain nonconductive as long as its gate voltage is higher than its anode voltage. In order to keep PUT 62 non-conductive as long as transistor Q3 is off, the values of resistors R26 and R27 as well as resistors R28, R29 an R30 are chosen so that the voltage at junction 74 will be more positive than the voltage at junction 68 as long as the battery voltage is above the critical value $E_{cr}$. Since PUT 62 is non-conductive at this time, there will be no driving current through diode D8 into the gate of SCR 64 and SCR 64 will also be non-conductive. In this condition, capacitor C5 will charge to the instantaneous battery voltage thereby forward biasing Diac 70 in the direction from the anode of SCR 64 to the gate of SCR 66. As a result, SCR 66 is conducting, and the load 72 is connected between the positive battery voltage and ground. Referring to FIG. 2, in a preferred application of the invention, the anode of SCR 66 is connected to a pump contacter coil 76 which in turn is connected through a lift switch 78 to the positive terminal of the battery. As long as the battery voltage is above the critical value and SCR 66 is conducting, the pump contactor coil 76 will be connected between the positive battery voltage and ground whenever the lift switch 78 is closed.

Referring again to FIG. 1B, the battery voltage will continually decrease until it reaches the critical value $E_{cr}$. As the battery voltage attains this value, the output of operational amplifier 44 will switch to the $+E_{sat}$ value and transistor Q3 will turn on. Particularly, the $+E_{sat}$ volts appearing at terminal 48 will forward bias diode D6 and a portion of the positive saturation voltage will be applied to the base of transistor Q3 thereby turning transistor Q3 on.

When transistor Q3 turns on the anode of diode D7 will be clamped to ground, diode D7 will be reverse biased, and time delay circuit 79 comprising PUT 62, capacitors C6 and C7 and their associated discharge resistors will be enabled. Particularly, capacitors C6 and C7, which are initially charged to the voltages appearing at junctions 74 and 68 respectively, will start discharging at independent time constants. The value of capacitors C6 and C7 as well as the resistors comprising their respective discharge paths are chosen such that capacitor C6 discharges appreciably faster than capacitor C7. Assuming this condition, as capacitors C6 and C7 continue to discharge, the gate voltage will eventually fall below the anode voltage and PUT 62 will become conductive. In the preferred embodiment, the values of capacitors C6 and C7 and the resistors in their respective discharge paths are chosen so that PUT 62 will become conductive approximately 15 minutes after the battery voltage has fallen to the critical value $E_{cr}$. It should be recognized however, that other delay times may be used without departing from the scope or spirit of the present invention. As PUT 62 becomes conductive, current flows through resistor R33 causing diode D8 to become forward biased. Since diode D8 is forward biased an enabling current is applied to the gate of SCR 64 and SCR 64 becomes conductive. In this condition, capacitor C5 will discharge at a very fast time constant through resistor R36 and Diac 70 will become forward biased in the direction from the gate of SCR 66 to the anode of SCR 64. This will cause SCR 66 to be non-conductive thereby disabling load 72.

At the same time that the load 72 is disabled, the current through SCR 64 will flow through resistor R36 and forward bias diode D10. Since diode D10 is forward biased, the IR drop appearing across resistor R36 will be applied to the base of transistor Q2 causing indicator lamp 60 to attain a steady state condition which indicates that the load 72 has been disabled.

The preferred values of the components of circuits 10, as described above, are given in Table 1 below.

TABLE 1

| Diodes | | Resistors | | | Capacitors | | Transistors | | Diac | SCR's | | PUT | |
|---|---|---|---|---|---|---|---|---|---|---|---|---|---|
| D1 | 1N4002 | R1 | 19.1K | R19 | 10K | C1 | 10µf | Q1 | 2M 3904 | 1N5758 | 64 | C106B2 | 62 | 2N6028 |
| D2 | 1N4742A | R2 | 1K | R20 | 47K | C2 | 10µf | Q2 | MPS-U05 | | 66 | C106D1 | | |
| D3 | 1N4746A | R3 | 11.5K | R21 | 47K | C3 | 2µf | Q3 | 2N4410 | | | | | |
| D4 | 1N4002 | R4 | 1M | R22 | 47Ω | C4 | 2µf | | | | | | | |
| D5 | 1N4002 | R5 | 5.1K | R23 | 10K | C5 | .1µf | | | | | | | |
| D6 | 1N4002 | R6 | 18K | R24 | 2K | C6 | 33µf | | | | | | | |
| D7 | 1N4002 | R7 | 20K | R25 | 47K | C7 | 10µf | | | | | | | |
| D8 | 1N4002 | R8 | 10K | R26 | 36K | | | | | | | | | |
| D9 | 1N4002 | R9 | 10K | R27 | 47K | | | | | | | | | |
| D10 | 1N4002 | R10 | 1K | R28 | 10K | | | | | | | | | |
| D11 | 1N4002 | R11 | 68Ω | R29 | 3K | | | | | | | | | |
| | | R12 | 5.K | R30 | 5.1K | | | | | | | | | |
| | | R13 | 180K | R31 | 1K | | | | | | | | | |
| | | R14 | 330Ω | R32 | 470K | | | | | | | | | |
| | | R15 | 1K | R33 | 100Ω | | | | | | | | | |
| | | R16 | 10K | R34 | 10K | | | | | | | | | |
| | | R17 | 100K | R35 | 22M | | | | | | | | | |
| | | R18 | 100K | R36 | 560Ω | | | | | | | | | |

In addition, operational amplifiers 38, 44 and 56 are Fairchild 741TC integrated circuits. It should be understood, however, that other integrated circuits and components having other values may also be used without exceeding the spirit and scope of the present invention.

In review, when operating in the battery testing mode, input and selector circuit 12 applies a predetermined percentage of the battery voltage to threshold detector and continuous energy indicator circuit 14. Threshold detector and continuous energy indicator circuit 14 monitors the voltage of the battery and provides a continuous indication of the instantaneous battery voltage. When the battery voltage falls to the critical value $E_{cr}$, threshold detector and continuous energy indicator circuit 14 generates an enabling signal $+E_{sat}$ which enables both low energy indicator circuit 16 and delay timer and disabling circuit 18. Particularly, the enabling signal enables multivibrator circuit 56 causing indicator lamp 60 to flash off and on. The enabling signal also turns on transistor Q3 thereby enabling time delay circuit 79. Once PUT 62 becomes conductive, it enables SCR 64 and disables SCR 66 thereby disabling load 72. As load 72 is disabled, transistor Q2 is biased on and indicator lamp 60 remains on until the battery is disconnected or recharged.

When operating in the self-testing mode, contact arm S1 of switch 20 is placed in contact with terminal 26 permitting capacitor C1 to discharge through resistor R4. Although, in the preferred embodiment, an RC circuit is used to generate an exponentially decaying signal, it should be understood that other signals and circuits having predictable decay rates may also be used within the spirit and scope of the invention.

When contact arm S1 initially makes contact with terminal 26, capacitor C1 is fully charged and the input voltage $E_I$ is sufficiently high to cause the output of operational amplifier 44 to remain at the $-E_{sat}$ value. As a capacitor discharges through resistor R4, input voltage $E_I$ will decrease causing control voltage $E_c$ to increase proportionally. The decreasing input voltage $E_I$ will be indicated by meter M1 and will eventually become sufficiently low to cause the output of operational amplifier 44 to switch to the $+E_{sat}$ value. At this time, indicator lamp 60 will begin flashing and transistor Q3 will be turned on enabling time delay circuit 79. When the predetermined time period has elapsed, PUT 62 will become conductive, the load 72 will be disabled and indicator light 60 will attain the steady state condition. As such, a decay in battery voltage to the critical value may be simulated in a matter of seconds and the operation of circuit 10 may be tested in a matter of minutes.

In the preferred embodiment described above, indicator lamp 60 is used as a visual alarm device to indicate the condition of the battery. It should be understood, however, that other alarm devices are also suitable for use in the invention. For example, an audible alarm device may be used in conjunction with, or in place of, lamp 60 within the spirit and scope of the invention.

The present invention may be embodied in other specific forms without departing from the spirit or essential attributes thereof and, accordingly, reference should be made to the appended claims, rather than to the foregoing specification as indicating the scope of the invention.

What is claimed is:

1. Apparatus for indicating the voltage level of a battery and for disabling a load connected to the battery, comprising:
   means for generating a control signal which is representative of the battery voltage when a first signal representative of the battery voltage is applied to said generating means and which is representative of an independent voltage which decreases at a fixed rate when said second signal representative of said independent voltage is applied to said generating means;
   means for selectively applying either said first signal or said second signal to said generating means so as to operate said apparatus in a battery testing or self-testing mode, respectively;
   first indicator means responsive to said control signal for continually indicating the instantaneous level of said battery voltage when said apparatus is in said battery testing mode and the instantaneous level of said independent voltage when said apparatus is operating in said self-testing mode, said first indicator means being electrically connected to said generator means; and
   second indicator means responsive to said control signal for indicating that said battery voltage has dropped below a first predetermined value when said apparatus is operating in said battery testing mode or that said independent voltage has dropped below a second predetermined value when said apparatus is operating in said self-testing mode, said second indicator means also for disabling the load after a predetermined time period has elapsed following a decrease in said battery voltage below said first predetermined value when said apparatus is operating in said battery testing mode or after a decrease in said independent voltage below said second predetermined level when said apparatus is operating in said self-testing mode, said second indicator means being electrically connected to said generator means.

2. Apparatus in accordance with claim 1, including:
   second generating means for generating said first signal in response to the actual decay rate of the battery;
   third generating means for generating said second signal at a fixed decay rate independent of the actual decay rate of the battery; and
   a switch for selectively connecting said second generating means or said third generating means to said means for generating a control signal.

3. Apparatus in accordance with claim 1, wherein said generating means includes a means for adjusting the relationship between said control signal and said battery and independent voltages so that said first and second predetermined levels of battery and independent voltages may be adjusted.

4. Apparatus in accordance with claim 3, wherein said generating means comprises an operational amplifier connected to operate as a difference amplifier with a variable resistor in its feedback loop.

5. Apparatus in accordance with claim 1, wherein said generating means comprises:
   an amplifier means for generating said control signal; and
   a follower circuit for resisting rapid voltage changes in said battery and said independent voltages, the input of said follower circuit being electrically connected to said selective means, the output of said follower circuit being electrically connected to said amplifier means.

6. Apparatus in accordance with claim 1, wherein said independent voltage is an exponentially decaying voltage.

7. Apparatus in accordance with claim 1, wherein said selective means comprises a double pole, single throw switch.

8. Apparatus in accordance with claim 1, wherein said second indicator means comprises:
   third indicating means for indicating that said battery voltage has dropped below said first predetermined value when said apparatus is operating in said battery testing mode or that said independent voltage has dropped below said second predetermined value when said apparatus is operating in said self-testing mode;
   time delay means for disabling the load after a predetermined time period has elapsed following a decrease in said battery voltage below said first predetermined value when said apparatus is operating in said battery testing mode or below said second predetermined value when said apparatus is operating in said self-testing mode;
   an enabling means responsive to said control signal for enabling said indicating means and said time delay means when said battery voltage has dropped below said first predetermined value when said apparatus is operating in said battery testing mode or when said independent voltage has dropped below said second predetermined value when said apparatus is operating in said self-testing mode.

9. Apparatus in accordance with claim 8 wherein said enabling means comprises an operational amplifier connected to operate as a comparator.

10. Apparatus in accordance with claim 8 wherein said third indicating means comprises a bistable multivibrator whose output is electrically connected to an indicator light such that said indicator light will flash on and off when said multivibrator is enabled.

11. Apparatus in accordance with claim 8, wherein said time delay means comprises:
a time delay circuit electrically connected to said enabling means for generating a disabling signal after a predetermined time period has elapsed following a decrease in said battery voltage below said first predetermined battery when said apparatus is operating in said battery testing mode or a decrease in said independent voltage below said second predetermined level when said apparatus is operating in said self-testing mode; and
a disabling means responsive to said disabling signal for disabling the load connected to the battery.

12. Apparatus in accordance with claim 11, wherein said time delay means includes a programmable unijunction transistor with a RC circuit electrically connected to the gate of said programmable unijunction transistor.

13. Apparatus in accordance with claim 11, wherein said disabling means includes a diac and a silicon control rectifier, said diac being electrically connected to the gate of said silicon controlled rectifier.

14. Apparatus in accordance with claim 1, including means for indicating that the load has been disconnected.

15. Apparatus for indicating the voltage of a battery and for disabling a load connected to the battery, comprising:
first generator means for generating a first signal representative of a battery voltage;
second generator means for generating a second signal representative of an independent voltage which decreases at a fixed rate;
amplifier means for generating a control signal which is representative of said battery voltage when said first signal is applied to said amplifier means and which is representative of said independent voltage when said second signal is applied to said amplifier means;
means for selectively applying either said first or said second signal to said amplifier means so as to selectively operate said apparatus in a battery testing or a self-testing mode, respectively;
first indicator means responsive to said control signal for continually indicating the instantaneous level of said battery voltage when said apparatus is operating in said battery testing mode and the instantaneous level of said independent voltage when said apparatus is operating in said self-testing mode, said first indicator means being electrically connected to said amplifier means;
second indicator means for indicating that said battery voltage has dropped below a first predetermined value when said apparatus is operating in said battery testing mode or that said independent voltage has dropped below a second predetermined value when said apparatus is operating in said self-testing mode;
disabling means for disabling the load after a predetermined time period has elapsed following a decrease in said battery voltage below said first predetermined value when said apparatus is operating in said battery testing mode or following a decrease in said independent voltage below said second predetermined level when said apparatus is operating in said self-testing mode; and
an enabling means responsive to said control signal for enabling said second indicating means and said disabling means when said battery voltage has dropped below said first predetermined value when said apparatus is operating in said battery testing mode or when said independent voltage has decreased below said second predetermined value when said apparatus is operating in said self-testing mode.

16. Apparatus in accordance with claim 15 wherein said amplifier means comprises an operational amplifier connected to operate as a difference amplifier.

17. Apparatus in accordance with claim 15, wherein said enabling means comprises an operational amplifier connected to operate as a comparator.

18. Apparatus in accordance with claim 15, wherein said disabling means comprises:
a time delay circuit electrically connected to said enabling means for generating a disabling signal after a predetermined time period has elapsed following a decrease in said battery voltage below said first predetermined battery when said apparatus is operating in said battery testing mode or a decrease in said independent voltage below said second predetermined level when said apparatus is operating in said self-testing mode; and
a disabling means responsive to said disabling signal for disabling the load connected to the battery.

19. Apparatus in accordance with claim 15, including means for indicating that the load has been disconnected.

* * * * *